(12) United States Patent
Hebert

(10) Patent No.: US 9,083,297 B2
(45) Date of Patent: Jul. 14, 2015

(54) PROGRAMMABLE-GAIN AMPLIFIER

(71) Applicant: THAT CORPORATION, Milford, MA (US)

(72) Inventor: Gary K. Hebert, Shrewsbury, MA (US)

(73) Assignee: THAT Corporation, Milford, MA (US)

( * ) Notice: Subject to any disclaimer, the term of this patent is extended or adjusted under 35 U.S.C. 154(b) by 0 days.

(21) Appl. No.: 13/888,931

(22) Filed: May 7, 2013

(65) Prior Publication Data

US 2013/0300503 A1 Nov. 14, 2013

Related U.S. Application Data

(60) Provisional application No. 61/645,300, filed on May 10, 2012.

(51) Int. Cl.
*H03F 3/45* (2006.01)
*H03G 3/00* (2006.01)
*H03G 1/00* (2006.01)

(52) U.S. Cl.
CPC ............. *H03G 3/00* (2013.01); *H03F 3/45475* (2013.01); *H03F 3/45932* (2013.01); *H03G 1/0088* (2013.01); *H03G 3/001* (2013.01); *H03F 2203/45138* (2013.01); *H03F 2203/45552* (2013.01); *H03F 2203/45591* (2013.01)

(58) Field of Classification Search
USPC .......................................... 330/254, 133, 307
IPC ........................................................ H03F 3/45
See application file for complete search history.

(56) References Cited

U.S. PATENT DOCUMENTS 6,141,169 A * 10/2000 Pietruszynski et al. ......... 360/67
6,570,448 B1    5/2003 Sobel
(Continued)

FOREIGN PATENT DOCUMENTS

EP    2128633    12/2009

OTHER PUBLICATIONS

International Search Report and the Written Opinion dated Jul. 31, 2013 from Corresponding PCT Application No. PCT/US2013/039948.

*Primary Examiner* — Patricia T Nguyen
(74) *Attorney, Agent, or Firm* — McDermott Will & Emery LLP

(57) ABSTRACT

An integrated circuit (IC) includes a programmable gain amplifier. The programmable gain amplifier comprises a first-stage amplifier configured to operate with at least one relatively high power supply voltage in order to accommodate at the input of the first-stage amplifier a relatively large range of input signals, the first-stage amplifier having a gain setting that is adjustable from a set of predetermined gain settings separated in relatively coarse increments so as to minimize the number of analog switches that must be implemented with high-voltage active devices in order to set each gain setting. The programmable gain amplifier also includes a second-stage amplifier configured to operate with at least one relatively low power supply voltage, lower than the high power supply voltage in order to minimize the required IC area for the second-stage amplifier, wherein the gain of the second-stage amplifier is adjustable from a set of gain settings separated in relatively small increments between the coarse increments in order to achieve a combined predetermined gain resolution. The gain of the programmable gain amplifier is programmable by adjusting the gain of each of the first-stage and second-stage amplifiers.

19 Claims, 4 Drawing Sheets

(56) References Cited

U.S. PATENT DOCUMENTS

| | | |
|---|---|---|
| 6,696,892 B1 * | 2/2004 | Behzad .................... 330/51 |
| 7,551,025 B2 * | 6/2009 | Margolis ................ 330/133 |
| 7,675,360 B2 * | 3/2010 | Arai et al. .................... 330/129 |
| 7,933,567 B2 * | 4/2011 | Guda et al. .................... 455/126 |
| 2002/0017953 A1 | 2/2002 | Singor et al. |
| 2003/0181179 A1 | 9/2003 | Darabi |

* cited by examiner

PROGRAMMABLE-GAIN AMPLIFIER

RELATED APPLICATIONS

This application is related to and claims priority from U.S. Provisional Patent Application No. 61/645,300 filed May 10, 2012 in the name of Gary K. Hebert and assigned to the present assignee. The contents of the referenced provisional application are incorporated herein in its entirety by reference.

FIELD

This application relates to programmable-gain amplifiers.

BACKGROUND

Programmable-gain amplifiers are known. See, for example, pending U.S. application Ser. No. 12/857,099 filed Aug. 16, 2010 in the name of Gary K Hebert and assigned to the present assignee. The contents of that application are herein incorporated by reference in its entirety.

SUMMARY

In accordance with one aspect of the invention an integrated circuit (IC) includes a programmable gain amplifier. The programmable gain amplifier comprises a first-stage amplifier configured to operate with at least one relatively high power supply voltage in order to accommodate at the input of the first-stage amplifier a relatively large range of input signals, the first-stage amplifier having a gain setting that is adjustable from a set of predetermined gain settings separated in relatively coarse increments so as to minimize the number of analog switches that must be implemented with high-voltage active devices in order to set each gain setting. The programmable gain amplifier also includes a second-stage amplifier configured to operate with at least one relatively low power supply voltage, lower than the high power supply voltage in order to minimize the required IC area for the second-stage amplifier, wherein the gain of the second-stage amplifier is adjustable from a set of gain settings separated in relatively small increments between the coarse increments in order to achieve a combined predetermined gain resolution. The gain of the programmable gain amplifier is programmable by adjusting the gain of each of the first-stage and second-stage amplifiers.

In accordance with another aspect of the invention, a method of manufacturing a programmable gain amplifier is described. The method includes configuring a first-stage amplifier to operate with at least one relatively high power supply voltage in order to accommodate at the input of the first-stage amplifier a relatively large range of input signals, the first-stage amplifier having a gain setting that is adjustable from a set of predetermined gain settings separated in relatively coarse increments so as to minimize the number of analog switches that must be implemented with high-voltage active devices in order to set each gain setting; and configuring a second-stage amplifier to operate with at least one relatively low power supply voltage, lower than the high power supply voltage in order to minimize the required IC area for the second-stage amplifier, wherein the gain of the second-stage amplifier is adjustable from a set of gain settings separated in relatively small increments between the coarse increments in order to achieve a combined predetermined gain resolution. The gain of the programmable gain amplifier is programmable by adjusting the gain of each of the first-stage and second-stage amplifiers.

DETAILED DESCRIPTION OF THE DRAWINGS

Figure 1:
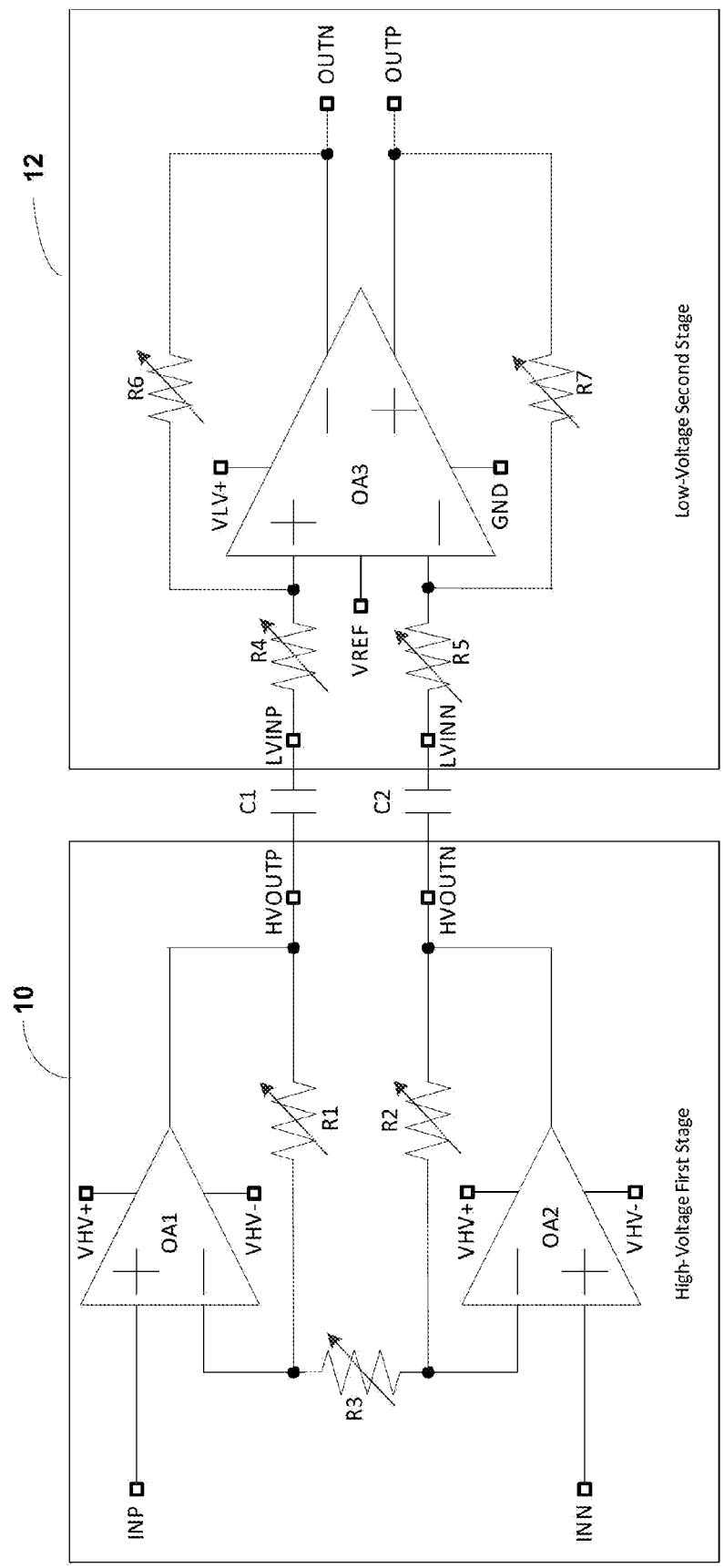
FIG. 1 is a block diagram of a programmable-gain amplifier circuit in accordance with the teachings herein illustrating a configuration most suited to applications where large common-mode input voltages will be encountered.

This application describes a programmable-gain amplifier (PGA), preferably in the form of an integrated circuit (IC), intended to properly condition analog signal voltages so that they may be applied as input signals to modern circuits, and in particular to modern analog-to-digital converter (ADC) integrated circuits (ICs) so that the applied signals are within the prescribed dynamic range of input signals (amplitudes) that such modern circuits can process. Most modern ADC ICs are fabricated in relatively low-voltage CMOS processes in order to take advantage of the high levels of integration in such processes. As a result, these ADC ICs have full-scale input voltages that are rarely more than a few volts. Thus, digitizing larger voltages, such as those typically encountered in professional audio and broadcast line level signals, requires the use of an attenuator connected to reduce the level of the audio and broadcast line level signals before being applied to the input of the ADC IC.

On the other hand signal voltages such as those typically available at the output of microphones, can be in the range of a few millivolts, requiring the use of an amplifier with substantial gain before being applied to the input of the ADC IC if the available input signal dynamic range of the converter is to be completely utilized.

Therefore there is a need for a PGA IC whose gain can be adjusted over a large dynamic range from less than unity (attenuation) to well above unity (amplification). Such a device should be able to accept input signal voltages well in excess of the limits of currently available ADC ICs, such as professional audio line-level signals that are often in excess of 10 Vrms (14.14 Vpeak). At the same time, the PGA IC should have low input noise, particularly at its highest gain settings, in order to not compromise the dynamic range of input signals such as those from dynamic microphones. The self-noise of such microphones is often taken to be on the order of the thermal noise of a 150-ohm resistor. The input noise voltage of a PGA IC used for this application should not contribute additional noise substantially above this level.

Amplifiers with low input noise voltage are preferably of the non-inverting configuration (also known as a series-shunt feedback amplifier), since those of the inverting type (also known as a shunt-shunt feedback amplifier) have an inherent tradeoff between input impedance and input noise voltage. Thus, it is desirable for a PGA intended to fulfill the previously stated requirements to utilize a first stage amplifier of the non-inverting configuration so that the input impedance can be chosen as best fits the application without compromising noise performance. As an illustration, an inverting amplifier may have an input impedance no greater than 150 ohms in order to avoid increasing the total noise of a microphone with a 150 ohm source impedance by less than 3 dB, ignoring any contribution from the active circuitry in the amplifier. This input impedance is lower than is desirable for most modern microphones, which typically should be loaded by resistances of at least 1 kohm. By contrast, a non-inverting amplifier can have its input impedance limited only by the input impedance of the active electronics, and can be arbitrarily set to any value less than this using a resistive termination on the input. This can be done without compromising the input noise voltage as long as the termination resistance is substantially greater than the source impedance.

The use of the non-inverting amplifier configuration implies that the input stage of the amplifier must accept the full dynamic range of an input signal voltage. This implies that the total power supply voltage for the amplifier input stage must be at least equal to the maximum expected input signal voltage for a single-ended input amplifier, or at least equal to half of the maximum expected input signal voltage for a differential-input amplifier. For the case of professional audio line level signals, the required power-supply voltages are in the range of 20 to 40 volts (or +/−10 volts to +/−20 volts for split power supplies). Implementing high voltage devices in an integrated-circuit process requires substantially more area on the integrated circuit than implementing low-voltage devices. Furthermore, circuitry operating from high power supply voltages will dissipate more power for a given operating current than circuitry operating from lower power supply voltages. Therefore it is desirable to minimize the circuitry that is operated from high voltage power supply voltages.

The following describes a PGA IC comprising a low-noise first-stage amplifier operating with at least one relatively high power supply voltage in order to accommodate at the input of the first-stage amplifier a relatively large dynamic range of input signals. The gain of this first stage amplifier is switched in relatively coarse steps in order to cover the desired range of gains (to accommodate the entire possible dynamic range of the input signal), but also to minimize the number of analog switches that must be implemented with high-voltage active devices. The PGA IC also comprises a second stage that operates with at least one relatively lower power supply voltage (lower than the power supply voltage(s) used with first stage) in order to minimize the IC area required. The power supply voltage(s) for this stage preferably match the power supply voltage(s) used for the analog circuitry (for example, in the ADC IC) to be driven by this second stage. The second stage amplifier is of the inverting configuration, allowing it to be set to gains less than unity. The gain of this second stage amplifier is switched in relatively small steps to fill in the gaps in the coarse steps of the first-stage gain, in order to achieve the desired overall gain resolution. Specifically, the gain of the second-stage amplifier is adjustable from a set of gain settings separated in relatively small increments. The increments fill the gaps between each of the coarse increments of the first-stage amplifier in order to achieve a combined predetermined gain resolution. For example, the gain increments of the second stage may be 1/10th that of the increments of the first stage. In this way the combined gain resolution in increased by 10 fold over the coarse gain resolution of the first stage.

A block diagram of one embodiment of such a PGA is shown in FIG. 1. The PGA includes two stages 10 and 12. The first stage 10 is a relatively high voltage amplifier stage, while second stage 12 is a relatively low voltage amplifier stage. Terminals INP and INN of the first stage 10 accept differential input voltages. The first stage includes operational amplifiers OA1 and OA2, along with resistors R1, R2, and R3, wherein the differential gain is defined substantially as:

$$A_{d1} = \frac{V_{HVOUTP} - V_{HVOUTN}}{V_{INP} - V_{INN}} = 1 + \frac{(R1 + R2)}{R3},$$

wherein $V_{INP}$ and $V_{INN}$ are the voltages at terminals INP and INN respectively, and $V_{HVOUTP}$ and $V_{HVOUTN}$ are the voltages at output terminals HVOUTP and HVOUTN, respectively.

The common-mode gain is defined substantially as:

$$A_{cm1} = \frac{V_{HVOUTP} + V_{HVOUTN}}{V_{INP} + V_{INN}} = 1.$$

Resistors R1 and R2 are preferably equal in value. The values of feedback-network resistors R1, R2, and R3 are varied using electronic switches to adjust the differential gain $A_{d1}$ of the first stage in relatively coarse steps or increments. Each of these successive steps in gain is preferably related to the previous step by a fixed ratio, so that each successive step changes the gain by a fixed amount in dB. In one embodiment the differential gain $A_{d1}$ is varied from a minimum of 0 dB or 1 V/V, with R3 being open circuited, to a maximum of 36 dB or 63.1 V/V in three 12-dB steps. There are various configurations for electronically varying the feedback network formed by R1, R2 and R3. One possible method in described in pending patent application, U.S. patent application Ser. No. 12/857,099 (published as US patent application publication number 2011/0068863 A1), filed Aug. 16, 2010, in the name of Gary Hebert and assigned to the present assignee, the subject matter of which is incorporated herein in its entirety by reference.

Referring again to FIG. 1, operational amplifiers OA and OA2 are powered from high-voltage power supply voltages, preferably applied at terminals VHV+ and VHV−. Note that while these terminals are duplicated on operational amplifiers OA1 and OA2 in FIG. 1, in practice there need only be a single pair of terminals on the IC. The voltage difference between terminals VHV+ and VHV− is chosen to allow the maximum anticipated signal voltages between input terminals INP and INN to be reproduced without excessive distortion between signals at output terminals HVOUTP and HVOUTN when the gain of the first stage is set to its minimum value. This implies that operational amplifiers OA1 and OA2 and their associated gain-switching circuitry must be realized using semiconductor devices with adequate voltage capability.

In the illustrated embodiment, second stage amplifier 12 includes fully-differential operational amplifier OA3, and feedback-network resistors R4 through R7. Resistors R4 and R5 are configured as input resistors for receiving signals applied to the stage's inputs LVINP and LVINN, and are each connected to an input of the amplifier OA3. Resistor R6 is connected between one input of OA3 and the inverting output associated with that input and resistor R7 is connected between the other input of OA3 and the inverting output associated with that input. The value of resistor R6 is preferably equal to the value of resistor R7, and the value of resistor R4 is preferably equal to the value of resistor R5. Under this condition, the differential gain is substantially:

$$A_{d2} = \frac{V_{OUTP} - V_{OUTN}}{V_{LVINP} - V_{LVINN}} = R6/R4,$$

wherein $V_{LVINP}$ and $V_{LVINN}$ are the voltages at terminals LVINP and LVINN, respectively; and $V_{OUTP}$ and $V_{OUTN}$ are the voltages at terminals OUTP and OUTN, respectively.

Fully differential operational amplifier OA3 of the second stage preferably incorporates an internal common-mode feedback loop which is configured to accept a reference input voltage at terminal VREF, and force the common mode voltage at terminals OUTP and OUTN to be substantially equal to the voltage at terminal VREF. As long as the ratio of the value of resistor R6 to the value of resistor R4 is equal to the ratio of the value of resistor R7 to the value of resistor R5, common-mode voltages at terminals LVINP and LVINN will be substantially rejected by the action of the common-mode feedback loop.

In the illustrated embodiment, the voltage applied to terminal VREF is preferably equal to the reference voltage of the ADC to be driven from output terminals OUTP and OUTN. The power supply voltages applied to terminals VLV+ and GND are preferably equal to the power supply voltages used for the analog portion of the ADC to be driven from output terminals OUTP and OUTN.

External AC-coupling capacitors C1 connected between the terminal HVOUTP and terminal LVINP and C2 connected between terminal HVOUTN and terminal LVINN serve to isolate the DC common-mode voltage at the HVOUTP and HVOUTN terminals from the input terminals LVINP and LVIN2, but to allow AC signals in the frequencies of interest to pass unattenuated. In many applications, the power supply for the second-stage amplifier at terminals VLV+ and GND will be a single supply voltage with respect to the ground reference voltage, while the power supply for the first stage amplifier will be so-called dual or split supply voltages with respect to the ground reference voltage. In such a case, the DC common-mode voltage at terminals HVOUTP and HVOUTN (generally equal to the common-mode voltage at the INP and INN terminals except for a small offset voltage) is typically chosen to be close to the ground reference voltage. This maximizes the potential voltage swing between the HVOUTP and HVOUTN terminals. This is substantially different from the common-mode output voltage at terminals OUTP and OUTN, which is generally between VLV+ and GND. This situation would result in DC current flowing through resistors R4 through R6 and would unnecessarily waste power if capacitors C1 and C2 were not included to block DC between the stages. However, capacitors C1 and C2 are not strictly necessary for proper operation of the circuit. Further, other configurations are possible within the scope of the subject technology, including the use of a common-mode servo loop around the first stage to set the DC common-mode output voltage at terminals HVOUTP and HVOUTN to be substantially equal to the voltage at the VREF terminal. Alternatively, the DC common-mode output voltage of the second stage could be set to match the DC common-mode output voltage of the first stage using an appropriate voltage at the VREF terminal. This would likely require ac-coupling of the second-stage output into the inputs of most current ADC ICs.

The values of feedback-network resistors R4 through R7 are varied using electronic switches to adjust the differential gain $A_{d2}$ of the second stage in fine steps to fill in the gaps in the gain steps of the first stage to achieve the desired gain resolution. Each of these successive steps in gain is preferably related to the previous step by a fixed ratio, so that each successive step or increment changes the gain by a fixed dB amount. Further, the fixed ratio between successive gains is preferably an integral submultiple of the fixed ratio between the successive first-stage gain steps, so that the overall gain of the complete PGA maybe varied in increments of the same equal number of dB per step. In one embodiment the second-stage differential gain $A_{d2}$ is varied from −20 dB to +1 dB in seven equal 3-dB steps by varying the values of resistors R6 and R7, keeping R6≈R7 at all eight settings. Additionally, resistors R4 and R5 may be varied to add additional gain steps, for example a single step which could add an additional +12 dB gain. When combined with a first stage whose gain is varied from 0 dB to 36 dB in 12-dB increments as previously mentioned, the overall gain range of the complete PGA is −20 dB to +49 dB in 3 dB increments. As a result, the two adjustable gains for the two stages define the dynamic range of the combination, and achieves a combined predetermined gain resolution.

By way of example, the Table 1 illustrates the values of resistors R1 through R7 for all of the gain settings for the configuration described above.

TABLE 1

| Total Gain (dB) | R3 (ohms) | R1, R2 (ohms) | Stage 1 Gain (dB) | R4, R5 (ohms) | R6, R7 (ohms) | Stage 2 Gain (dB) |
| --- | --- | --- | --- | --- | --- | --- |
| −20 | Open | 4k | 0 | 18k | 1.8k | −20 |
| −17 | Open | 4k | 0 | 18k | 2.54k | −17 |
| −14 | Open | 4k | 0 | 18k | 3.59k | −14 |
| −11 | Open | 4k | 0 | 18k | 5.07k | −11 |
| −8 | 2.68k | 4k | 12 | 18k | 1.8k | −20 |
| −5 | 2.68k | 4k | 12 | 18k | 2.54k | −17 |
| −2 | 2.68k | 4k | 12 | 18k | 3.59k | −14 |
| +1 | 2.68k | 4k | 12 | 18k | 5.07k | −11 |
| +4 | 539 | 4k | 24 | 18k | 1.8k | −20 |
| +7 | 539 | 4k | 24 | 18k | 2.54k | −17 |
| +10 | 539 | 4k | 24 | 18k | 3.59k | −14 |
| +13 | 539 | 4k | 24 | 18k | 5.07k | −11 |
| +16 | 129 | 4k | 36 | 18k | 1.8k | −20 |
| +19 | 129 | 4k | 36 | 18k | 2.54k | −17 |
| +22 | 129 | 4k | 36 | 18k | 3.59k | −14 |
| +25 | 129 | 4k | 36 | 18k | 5.07k | −11 |
| +28 | 129 | 4k | 36 | 18k | 7.17k | −8 |
| +31 | 129 | 4k | 36 | 18k | 10.1k | −5 |
| +34 | 129 | 4k | 36 | 18k | 14.3k | −2 |
| +37 | 129 | 4k | 36 | 18k | 20.2k | +1 |
| +40 | 129 | 4k | 36 | 4.52k | 7.17k | +4 |
| +43 | 129 | 4k | 36 | 4.52k | 10.1k | +7 |
| +46 | 129 | 4k | 36 | 4.52k | 14.3k | +10 |
| +49 | 129 | 4k | 36 | 4.52k | 20.2k | +13 |

This example is for illustrative purposes only. There are many other possible combinations of gain range and resolution possible within the scope of the subject technology. In particular, it may be advantageous in some cases to make the resistance values of resistors R1, R2 and/or resistor R3 adjustable so that the resistive value of each can be varied in order to implement changes in the first-stage gain.

The minimum gain of the second stage is preferably chosen to attenuate (a gain factor of less than one) the maximum expected differential output voltage at first-stage output terminals HVOUTP and HVOUTN to the full-scale input voltage of the ADC to be driven from the second-stage output terminals OUTP and OUTN. This ensures that the full dynamic range of the first stage is utilized. In the illustrative example above, the minimum second-stage gain of −20 dB will attenuate a 20 Vrms signal voltage at the HVOUTP and HVOUTN terminals to 2 Vrms, which is a common full-scale input voltage for current ADCs.

At the highest overall gain settings, the input noise of the first stage amplifier multiplied by its gain will often be the dominant noise source, overwhelming the contributions of the second stage or an ADC to which the two stage amplifier is connected. Once this is the case, there is no further advantage in increasing gain in the first stage amplifier in order to increase the total gain. It is therefore preferable that further increases in gain be implemented in the second stage, which can be accomplished with low-voltage semiconductor devices which occupies less silicon area than high-voltage semiconductor devices. This case is illustrated in the example above for the eight highest gain settings where the first-stage gain is held constant at +36 dB, while a second set of feedback resistances is utilized around the second stage to allow it gain to be varied between −8 dB and +13 dB in equal 3 dB increments or steps. The additional low-voltage electronic switches required occupy much less area than even a single additional high-voltage switch to add a +48 dB gain setting to the first stage.

As stated above, the common-mode gain of the first stage is unity, so any AC common-mode voltages present at input terminals INP and INN are passed unattenuated to the second stage input terminals LVINP and LVINN. Such common-mode voltages will result in a voltage at operational amplifier OA3's inverting and non-inverting input terminals equal to:

$$V_{OA3IN} = V_{CMIN} * \left(\frac{R6}{R4 + R6}\right) + V_{VREF} * \left(\frac{R4}{R4 + R6}\right),$$

where $V_{OA3IN}$ is the voltage at either of operational amplifier OA3's input terminals, $V_{CMIN}$ is the common-mode input voltage at terminals INP and INN, and $V_{VREF}$ is the voltage at the VREF terminal.

Since operational amplifier OA3 operates from substantially lower power supply voltages than operational amplifiers OA1 and OA2, the allowable voltage swing before severe distortion at the input terminals of operational amplifier OA3 is substantially less that at the input or output terminals of operational amplifiers OA1 and OA2.

Figure 2:
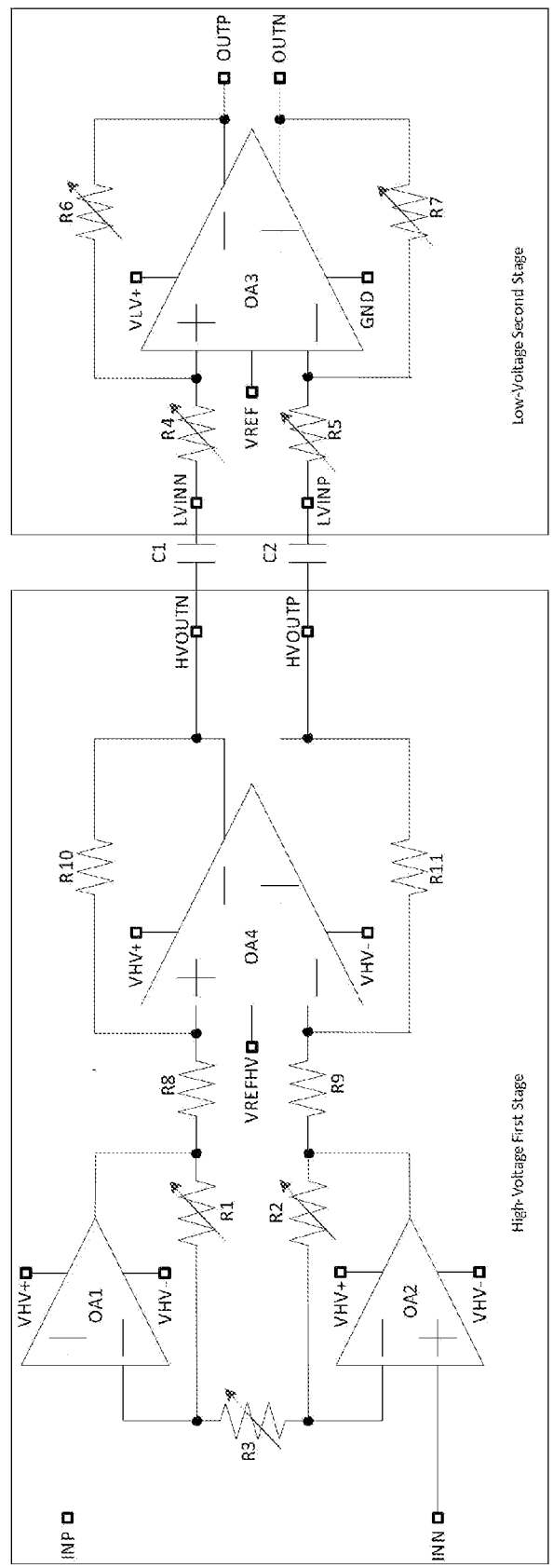
FIG. 2 is a block diagram of a programmable-gain amplifier circuit in accordance with the teachings herein illustrating a configuration with increased tolerance of large common-mode input voltages compared to that in FIG. 1.

In many applications common-mode interference on the order of one volt or more is not uncommon. In these cases, it is desirable to prevent the common-mode interference voltage from appearing at the input terminals of operational amplifier OA3 in order to preserve the available linear voltage range of the second, low-voltage stage for desired differential signals. FIG. 2 shows a block diagram of a second example of a programmable gain amplifier PGA IC configuration that fulfills this goal.

In FIG. 2 fully-differential operational amplifier OA4 and its associated resistors R8 through R11 have been added to the first-stage differential amplifier arranged to receive the outputs of the configuration formed by operational amplifiers OA1 and OA2, and the resistors R1, R2 and R3. Specifically, the output node connecting the output of operational amplifier OA1 with feed back resistor R1 is connected to input resistor R8, which in turn is connected to the non-inverting input of the operational amplifier OA4; while the output node connecting the output of operational amplifier OA2 with feed back resistor R2 is connected to input resistor R9, which in turn is connected to the inverting input of the operational amplifier OA4. Feedback resistor R10 is connected between the negative output and the non-inverting input of operational amplifier OA4, while feedback resistor R11 is connected between the positive output and the inverting input of the operational amplifier OA4. The output node connecting the negative output and feedback resistor R10 is connected to the output pin HVOUTN, and the output node connecting the positive output and the feedback resistor R11 is connected to the output pin HVOUTP. Fully-differential operational amplifier OA4 is connected to the same pair of high-voltage power supply terminals VHV+ and VHV− as operational amplifiers OA1 and OA2, and will thus have similar maximum differential output voltage capability. In order to maximize the available dynamic range, the values of resistors R8 through R11 are all equal, setting the differential gain from the output terminals of operational amplifiers OA1 and OA2 to the output terminals of fully-differential operational amplifier OA4 to unity, keeping its output signal as high as possible without premature clipping.

Fully differential operational amplifier OA4 preferably incorporates an internal common-mode feedback loop which is configured to accept a reference input voltage at terminal VREFHV, and force the common mode voltage at terminals HVOUTP and HVOUTN to be substantially equal to the voltage at terminal VREFHV. As long as the ratio of the value of resistor R8 to the value of resistor R10 is equal to the ratio of the value of resistor R9 to the value of resistor R11, common-mode voltages at terminals INP and INN will be substantially rejected by the action of the common-mode feedback loop, and thus prevented from being passed on to the low-voltage second stage amplifier.

The voltage applied to terminal VREFHV is preferably close to midway between the power supply voltages applied to terminals VHV+ and VHV− in order to maximize the available output voltage swing at terminals HVOUTP and HVOUTN.

Figure 3:
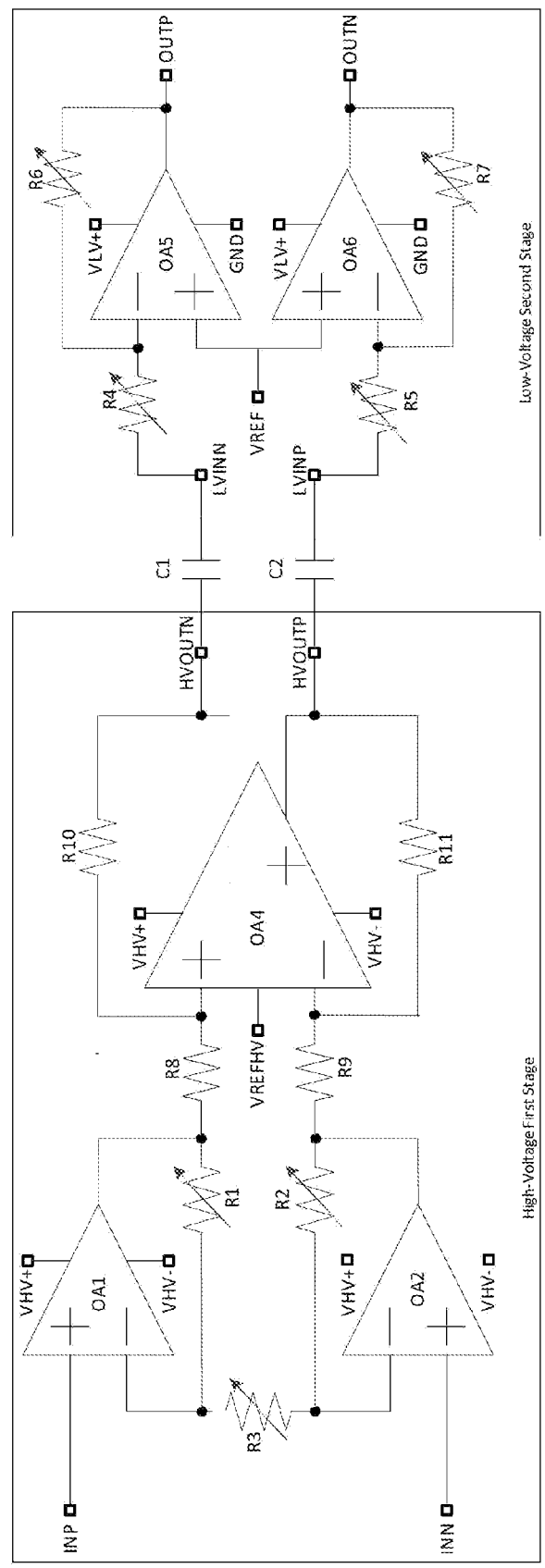
FIG. 3 is a block diagram of a programmable-gain amplifier circuit in accordance with the teachings herein illustrating a configuration similar to FIG. 2, with added flexibility for driving analog-to-digital converters with either differential or single-ended input configurations.

With the addition of fully-differential operational amplifier OA4 and resistors R8 through R11 to the high-voltage first-stage amplifier circuit, there is no longer any need for the second-stage amplifier circuit to provide common-mode rejection. In this case the second-stage amplifier may be implemented as illustrated in FIG. 3. In FIG. 3 fully-differential operational amplifier OA3 from FIGS. 1 and 2 has been replaced with operational amplifiers OA5 and OA6. These two operational amplifiers also operate from power supply voltages applied to terminals VLV+ and GND which are lower than those applied to terminals VHV+ and VHV−, and are preferably identical to those used to power the ADC to be driven from terminals OUTP and OUTN. Resistors R4 through R7 function as previously described for FIG. 1 and preferably follow the same constraints previously mentioned. This second-stage amplifier comprising operational amplifiers OA5 and OA6 and resistors R4 through R7 provides no rejection of common-mode voltages at the LVINP and LVINN terminals, but since common-mode input voltages present at terminals INP and INN are ultimately rejected by operational amplifier OA4 and its associated resistors, this is not strictly necessary. The advantage of using single-ended operational amplifiers OA5 and OA6 rather than fully-differential operational amplifier OA3 is that it provides the flexibility to drive ADC ICs with either balanced or single-ended inputs. For the case of a single-ended-input ADC IC only one of the outputs OUTP or OUTN is necessary, and the unused operational amplifier (OA5 or OA6) may be put into a low-power, non-operational state to reduce power dissipation.

Figure 4:
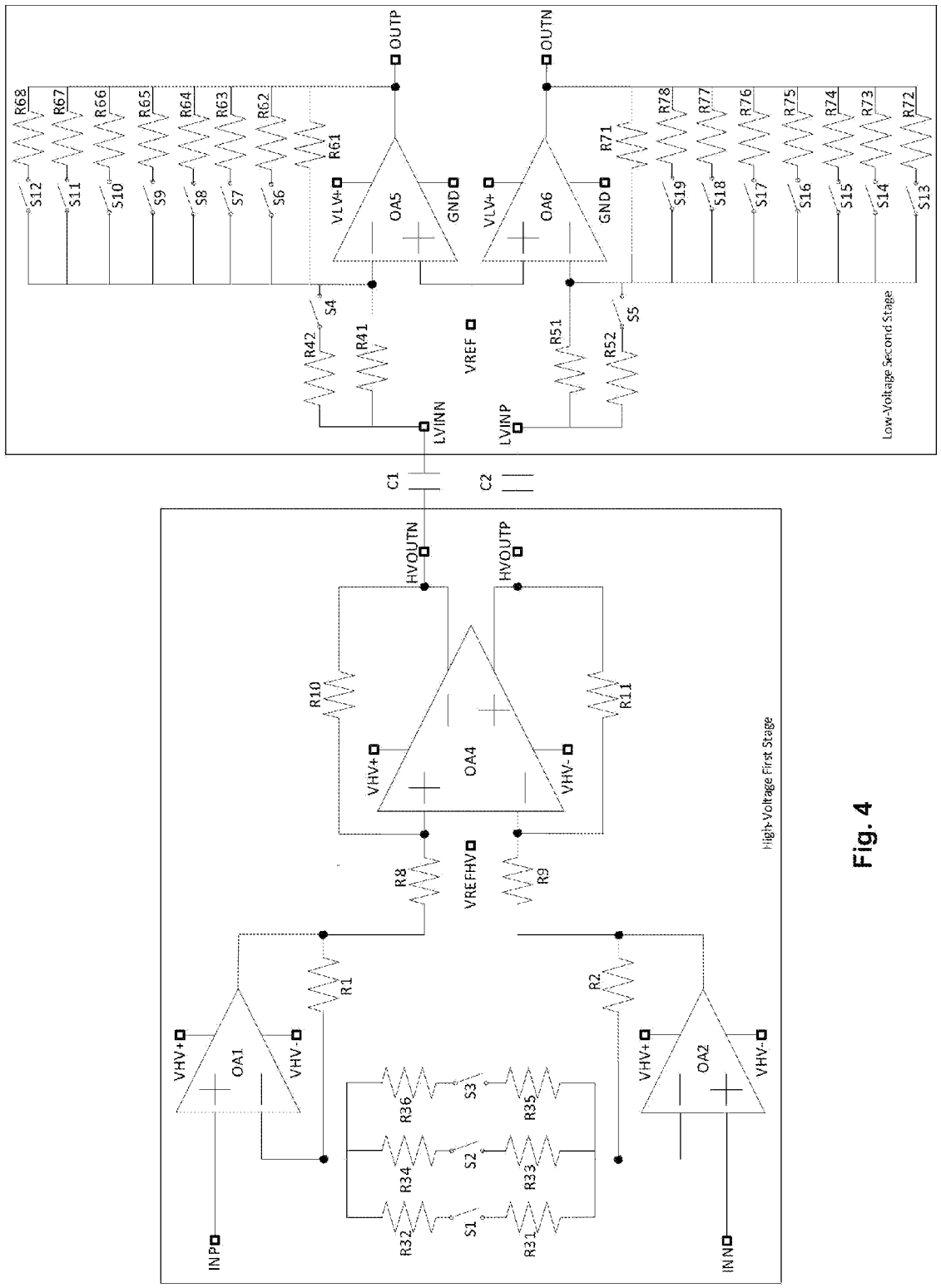
FIG. 4 is a more detailed block diagram of the programmable-gain amplifier circuit in FIG. 3 illustrating one possible arrangement of electronic switches and resistors.

FIG. 4 shows one possible implementation of a switching arrangement to implement the changes in resistor values set forth in the example above. Switches S1 through S19 are all representative, for example, of electronically-controlled analog transmission gates, which can be, but not necessarily, implemented in integrated circuit form using complementary MOS (Metal-Oxide-Semiconductor) transistors. In a preferred embodiment, these switches might be controlled using a gate-drive circuit as described in US published patent application 2011/0068833 A1 in order to minimize the distortion contribution due to the modulation of the on-resistance of the switches by signal voltage changes, the referenced application being incorporated herein and attached hereto.

Switches S1 through S3 in FIG. 4 serve to vary the net resistance between the inverting input terminals of operational amplifiers OA1 and OA2. (This resistance is referred to as R3 in FIGS. 1 through 3 and Table 1.) These three switches are each connected between a pair of equal-valued resistors that are selected to implement the desired first-stage gain settings as the switches are successively closed. Keeping the switches at the junction of these equal-valued pairs of resistors R31-R32, R33-R34, and R34-R35 minimizes the voltage swings at the switch terminals as a result of differential input voltages. This further minimizes the distortion caused by variation of the switch on-resistance with signal voltage changes.

The resistance values for R3 listed in Table 1 could be implemented using the arrangement in FIG. 4 as follows: To set the first-stage gain to unity (0 dB), all three switches S1 through S3 are off, or open circuited. This corresponds to the total-gain settings of −20 dB, −17 dB, −14 dB, and −11 dB in Table 1. To set the first-stage gain to +12 dB, switch S1 is turned on to a low-resistance state, while switches S2 and S3 are turned off. This corresponds to the total-gain settings of −8 dB, −5 dB, −2 dB, and +1 dB in Table 1. Assuming that resistors R1 and R2 each have a value of 4 kohms as listed in Table 1, resistors R31 and R32 each have a value of:

$$R31 = R32 = \frac{2680 - R_{S1}}{2},$$

where $R_{S1}$ is the nominal on-resistance of electronic switch S1.

To set the first-stage gain to +24 dB, switches S1 and S2 are both turned on, while switch S3 is turned off. This corresponds to the total-gain settings of +4 dB, +7 dB, +10 dB, and +13 dB in Table 1.

Again assuming that R1 and R2 each have a value of 4 kohms, R33 and R34 have a value of:

$$R33 = R34 = \frac{674 - R_{S2}}{2},$$

where $R_{S2}$ is the nominal on-resistance of electronic switch S2.

To set the first-stage gain to +36 dB, switches S1, S2, and S3 are all turned on. This corresponds to the total-gain settings +16 dB through +49 dB in Table 1. Again assuming that R1 and R2 each have a value of 4 kohms, R35 and R36 have a value of:

$$R35 = R36 = \frac{169 - R_{S3}}{2},$$

where $R_{S3}$ is the nominal on-resistance of electronic switch S3.

Successively adding the resistor-switch combinations in parallel as the first-stage gain is increased (and the net value of R3 is reduced) serves to minimize the influence of the switch on-resistance on the gain accuracy. Preferably the on-resistance of switches S1 through S3 would be made proportional to the sum of the resistances connected in series with each switch, such that:

$$R_{S1} = \frac{R_{S2} * (R31 + R32)}{(R33 + R34)} = \frac{R_{S3} * (R31 + R32)}{(R35 + R36)}.$$

The influence of switch on-resistance on the gain accuracy may be further reduced by placing an additional switch in series with each of resistors R1 and R2. These switches would always be on during normal operation, and would serve to substantially cancel the influence of the switch on-resistance on gain accuracy. The on-resistance of these switches would preferably be chosen as follows:

$$R_{SR1} = R_{SR2} = \frac{R_{S1} * R1}{(R31 + R32)} = \frac{R_{S3} * R1}{(R33 + R34)} = \frac{R_{S3} * R1}{(R35 + R36)},$$

where $R_{SR1}$ and $R_{SR2}$ are the nominal on-resistances of the permanently-on electronic switches in series with resistors R1 and R2 respectively.

Switches S4 and S5 in FIG. 4 serve to vary the net resistance between the LVINN and the inverting input of operational amplifier OA5, and between the LVINP terminal and the inverting input of operational amplifier OA6, respectively. (These resistances are referred to as R4 and R5 respectively in FIG. 3 and Table 1.) These switches connect resistors R42 and R52 in parallel with resistors R41 and R51, respectively, to scale up the second stage gain as needed for the highest total-gain settings. Switches S4 and S5 are preferably have one terminal connected to their respective series resistor and the other end to the inverting input of their respective operational amplifier. This minimizes voltage changes on the switch terminals due to signal voltages since the operational amplifier inverting inputs are virtual grounds, thus minimizing the distortion contribution due to modulation of the switch on-resistance by the signal voltage.

The resistance values for resistors R4 and R5 listed in Table 1 could be implemented using the arrangement in FIG. 4 as follows: Resistors R41 and R51 are chosen to be 18 kohms each. Resistors R42 and R52 are chosen to be 6.04 kohms each, minus the nominal on-resistance of switch S4 or S5. Switches S4 and S5 are turned off for Table 1 total gain settings between −20 dB and +37 dB. Switches S4 and S5 are turned on for Table 1 total gain settings between +40 dB and +49 dB.

Switches S6 through S12 in FIG. 4 serve to vary the net feedback resistance from the output terminal to the inverting input terminal of operational amplifier OA5. Similarly, switches S13 through S19 serve to vary the net feedback resistance from the output terminal to the inverting input terminal of operational amplifier OA6. (These resistances are indicated at R6 and R7, respectively in FIGS. 3 and as R6 and R7 in Table 1.) Switches S6 through S12 connect resistors R62 through R68, respectively, in parallel with resistor R61. Switches S13 through S19, when closed, respectively connect resistors R72 through R78 in parallel with resistor R71. All of these switches S6 through S19 have one terminal connected to an operational amplifier inverting input terminal and the other terminal connected through a series resistor to an operational amplifier output terminal in order to minimize voltage changes on the switch terminals due to changes in signal voltages.

By way of example, the resistance values for resistors R6 and R7 listed in Table 1 could be implemented using the arrangement in FIG. 4 by first choosing resistor values according to Table 2 below:

TABLE 2

| Resistor (and associated switch on-resistance) | Value (ohms) |
|---|---|
| R61, R71 | 20.2k |
| R62 + $R_{s6}$, R72 + $R_{s13}$ | 49k |
| R63 + $R_{s7}$, R73 + $R_{s14}$ | 34.4k |
| R64 + $R_{s8}$, R74 + $R_{s15}$ | 24.7k |
| R65 + $R_{s9}$, R75 + $R_{s16}$ | 17.3k |
| R66 + $R_{s10}$, R76 + $R_{s17}$ | 12.3k |
| R67 + $R_{s11}$, R77 + $R_{s18}$ | 8.7k |
| R68 + $R_{s12}$, R78 + $R_{s19}$ | 6.2k | where $R_{Sk}$ is the on-resistance of switch Sk.

An example of a set of switch settings to implement the values for resistors R6 and R7 listed in Table 1 using the resistor values in Table 2 is summarized in Table 3 below:

TABLE 3

| Stage 2 Gain (dB) | S4, S5 | S6, S13 | S7, S14 | S8, S15 | S9, S16 | S10, S17 | S11, S18 | S12, S19 |
|---|---|---|---|---|---|---|---|---|
| −20 | OFF | ON | ON | ON | ON | ON | ON | ON |
| −17 | OFF | ON | ON | ON | ON | ON | ON | OFF |
| −14 | OFF | ON | ON | ON | ON | ON | OFF | OFF |
| −11 | OFF | ON | ON | ON | ON | OFF | OFF | OFF |
| −8 | OFF | ON | ON | ON | OFF | OFF | OFF | OFF |
| −5 | OFF | ON | ON | OFF | OFF | OFF | OFF | OFF |
| −2 | OFF | ON | OFF | OFF | OFF | OFF | OFF | OFF |
| +1 | OFF | OFF | OFF | OFF | OFF | OFF | OFF | OFF |
| +4 | ON | ON | ON | ON | OFF | OFF | OFF | OFF |
| +7 | ON | ON | ON | OFF | OFF | OFF | OFF | OFF |
| +10 | ON | ON | OFF | OFF | OFF | OFF | OFF | OFF |
| +13 | ON | OFF | OFF | OFF | OFF | OFF | OFF | OFF |

The on-resistances of the switches S4 through S19 in FIG. 4 should preferably be proportional to the value of their associated series resistor. For example:

$$R_{S4} = R_{S5} = R_{S6} * \frac{R42}{R62} = R_{S13} * \frac{R52}{R72} =$$
$$R_{S7} * \frac{R42}{R63} = R_{S14} * \frac{R52}{R73} = R_{S8} * \frac{R42}{R64} = R_{S15} * \frac{R52}{R74} \ldots \text{etc.},$$

where $R_{Sk}$ is the on-resistance of switch Sk.

Gain accuracy of the second stage circuit shown in FIG. 4 can be enhanced by including electronic switches in series with resistors R41, R51, R61, and R71 that are always on in normal operation. The on-resistance of these switches would preferably be proportional to the value of the resistor that each is in series with such that:

$$R_{SR41} = R_{SR51} = R_{SR61} * \frac{R41}{R61} = R_{SR71} * \frac{R51}{R71} =$$
$$R_{S4} * \frac{R41}{R42} = R_{S5} * \frac{R51}{R52} = R_{S6} * \frac{R41}{R62} = R_{S13} * \frac{R51}{R72} \ldots \text{etc.}$$

where $R_{Sk}$ is the on-resistance of switch Sk, and $R_{SRn}$ is the on-resistance of the always-on switch in series with resistor Rn.

Operational amplifiers OA1 and OA2 in FIG. 1 will almost always exhibit finite input offset voltages that will not be matched to one another. The difference between the input offset voltages of operational amplifiers OA1 and OA2 constitute a net differential input offset voltage for the first-stage amplifier of FIG. 1. Changes in DC gain as a result of varying the feedback network comprising resistors R1, R2, and R3 will result in changes in the differential DC voltage at output terminals HVOUTP and HVOUTN. Such changes in DC output voltage result in audible "thumps" when gain changes occur in audio applications. It is therefore preferable in audio applications that the DC gain is kept constant while the AC gain is varied. One solution is to add a capacitor in series with resistor R3 in FIG. 1. The addition of such a capacitor forces the DC differential gain of the first-stage amplifier to be unity for all combinations of resistors R1, R2 and R3. It is preferable to choose the ac-coupling capacitor in series with resistor R3 such that its effect on the AC gain is well below the frequencies of interest in the application. For audio applications, this implies that the highpass filter pole formed by resistor R3 (at its lowest value) and capacitor C3 must be well below 20 hertz. Since low noise is a goal of the subject technology, in the example resistor R3 will typically be less than several hundred ohms at its lowest value, which implies a value for the coupling capacitor that is impractical to include on an integrated circuit. Thus a pair of pins may be added to the integrated circuit to allow the connection of an external ac-coupling capacitor in series with R3 (or its equivalent network as shown in FIGS. 2 through 4). Other approaches to maintaining constant DC gain in the first-stage amplifier are also possible within the scope of the subject technology. These include the use of an additional servo amplifier with low input offset voltage to monitor the differential output of the first-stage amplifier and to add a correction voltage to the first-stage amplifier input via a negative feedback loop.

The level of the high power supply voltage(s) used with the first-stage amplifier and the range of input signals constituting the large range of input signals are a function of the application of the integrated circuit. Further, the gain setting of first-stage amplifier is adjustable from any one of a set of predetermined gain settings separated in relatively coarse increments so as to minimize the number of analog switches that must be implemented with high-voltage active devices in order to set each gain setting.

It should be apparent that in this example there are more available settings of second-stage amplifier gain than necessary to provide the desired gain resolution (3 dB in this case) between the coarse 12 dB gain steps of the first stage amplifier. With 33 dB of gain range in the second stage (−20 dB to +13 dB), the first stage gain steps could be reduced to 0 dB and +36 dB only, and the −20 dB to +49 dB total-gain range in 3-dB steps could still be achieved. However, in practice keeping the first-stage gain so low over the first 36 dB of gain settings results in the second stage noise contributing excessively to the overall input noise at the upper end of this gain range, thus compromising dynamic range. Since the second-stage amplifier is configured in inverting mode, which is required in order to be set to gains less than unity, its noise is compromised unless its input impedance is made very low. Scaling down the values of the feedback resistors around OA5 and OA6 would require increased output current from the first stage, and larger values for external coupling capacitors C1 and C2. These are some of the possible tradeoffs that can be made within the scope of the subject technology to meet the needs of specific applications.

It should also be apparent that it is possible to provide for higher resolution (e.g., 1 dB or 2 dB) or less resolution (e.g. 4 dB or 6 dB) while staying within the teachings of the subject technology. Thus, the resolution of the second stage can be set with the relatively small increments in the range, for example, of 1 dB to 6 dB. In addition, the resolution of the first stage can be set with the relatively coarse increments being a whole number multiple of the setting of the small increments. Thus, based on the example of the foregoing example, an example of the relatively coarse increments of gain of the first stage can be within the range of 2 dB to 12 dB. As well, alternative distributions of switches and resistances may be made, such as providing more variation in the values of R4 and R5 in Table 1, and fewer variations in the values of R6 and R7, or providing more variations in the values of R3 in Table 1, or in providing some variations in the values of R1 and R2. These and other variations of the subject technology may allow it to be adapted to different requirements for noise and dynamic range performance as well as different gain ranges and step sizes, all of which can adapt the subject technology to different application requirements.

While the foregoing has described one or more examples of embodiments of the claimed subject matter, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are by way of example, and are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element. The word "coarse" is relative to the "small" steps of the second-stage amplifier. The number of predetermined gain settings in the set and the "minimum number of analog switches" is a function of the application to which the integrated circuit is used.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An integrated circuit (IC) including a programmable gain amplifier, the programmable gain amplifier comprising:
    a first-stage amplifier configured to operate with at least one relatively high power supply voltage in order to accommodate at the input of the first-stage amplifier a relatively large range of input signals, the first-stage amplifier having a in setting that is adjustable from a set of predetermined gain settings separated in relatively coarse increments so as to minimize the number of analog switches that must be implemented with high-voltage active devices in order to set each gain setting; and
    a second-stage amplifier configured to operate with at least one relatively low power supply voltage, lower than the high power supply voltage in order to minimize the required IC area for the second-stage amplifier, wherein the gain of the second-stage amplifier is adjustable from a set of gain settings separated in relatively small increments between the coarse increments in order to achieve a combined predetermined gain resolution;
    wherein the gain of the programmable gain amplifier is programmable by adjusting the gain of each of the first-stage and second-stage amplifiers;
    wherein the first-stage amplifier includes a differential amplifier arrangement;
    wherein the second-stage amplifier includes a fully differential operational amplifier; and
    wherein the fully differential operational amplifier includes an internal common-mode feedback loop configured to (1) accept a reference input voltage and (2) force a common mode voltage at the output terminals of the second-stage amplifier to be substantially equal to the reference input voltage.

2. An integrated circuit according to claim 1, wherein the gain of the programmable gain amplifier being programmable between a gain of less than unity and a gain above unity.

3. An integrated circuit according to claim 1, wherein the first-stage amplifier is a low-noise amplifier.

4. An integrated circuit according to claim 1, wherein the second-stage amplifier employs shunt-shunt negative feedback and is configured to operate with at least one power supply.

5. An integrated circuit according to claim 4, further including an output adapted to be coupled to the input of an analog-to-digital converter including analog circuitry configured to operate with the relatively low power supply voltage.

6. An integrated circuit according to claim 1, wherein the second-stage amplifier employs shunt-shunt negative feedback so as to allow the second-stage amplifier to be set to gain settings that include gains that are less than unity.

7. An integrated circuit according to claim 1, wherein each of the coarse increments of the predetermined resolution of the first-stage amplifier is a whole number multiple of each of the relatively small increments of gain settings of the second-stage amplifier.

8. An integrated circuit according to claim 1, wherein the relatively small increments of gain settings of the second-stage amplifier define the resolution of the combination of the first and second-stage amplifiers.

9. An integrated circuit according to claim 1, wherein each of the relatively small increments is in the range of 1 dB to 6 dB.

10. An integrated circuit according to claim 1, wherein each successive increment in gain of the programmable gain amplifier is related to the previous increment by a fixed ratio so that each successive increment changes the gain by a fixed amount in dB.

11. An integrated circuit according to claim 10, wherein the differential gain $A_{d1}$ is varied from a minimum of 0 dB to a maximum of 36 dB.

12. An integrated circuit according to claim 1, wherein the first-stage amplifier includes a differential amplifier arrangement.

13. An integrated circuit according to claim 12, wherein the differential amplifier arrangement includes a pair of operational amplifiers, configured to provide programmable gain for differential input voltages and unity gain for common-mode input voltages.

14. An integrated circuit according to claim 1, further including AC coupling capacitors connected between the outputs of the first-stage amplifier and the inputs of the second-stage amplifier.

15. An integrated circuit according to claim 1, wherein the first-stage amplifier has an AC gain setting, and a DC in set to unity regardless of the AC in setting of the first-stage amplifier.

16. An integrated circuit according to claim 1, wherein each of the first-stage and second-stage amplifiers each include feedback-network resistors adjustable so as to adjust the gain of the corresponding stage amplifier.

17. An integrated circuit according to claim 1. wherein the minimum gain of the second-stage amplifier attenuates the maximum expected output voltage of the first-stage amplifier to the full-scale input voltage of the device to be driven by the second stage amplifier output.

18. A method of manufacturing a programmable gain amplifier, the programmable gain amplifier comprising:
configuring a first-stage amplifier to operate with at least one relatively high power supply voltage in order to accommodate at the input of the first-stage amplifier a relatively large range of input signals, the first-stage amplifier having a gain setting that is adjustable from a set of predetermined gain settings separated in relatively coarse increments so as to minimize the number of analog switches that must be implemented with high-voltage active devices in order to set each gain setting; and
configuring a second-stage amplifier to operate with at least one relatively low power supply voltage, lower than the high power supply voltage in order to minimize the required IC area for the second-stage amplifier, wherein the gain of the second-stage amplifier is adjustable from a set of gain settings separated in relatively small increments between the coarse increments in order to achieve a combined predetermined gain resolution:
wherein the gain of the programmable gain amplifier is programmable by adjusting the gain of each of the first-stage and second-stage amplifiers;
wherein the first-stage amplifier includes a differential amplifier arrangement;
wherein the second-stage amplifier includes a fully differential operational amplifier; and
wherein the fully differential operational amplifier includes an internal common-mode feedback loop configured to (1) accept a reference input voltage and (2) force a common mode voltage at the output terminals of the second-stage amplifier to be substantially equal to the reference input voltage.

19. A method according to claim 18, wherein configuring the first and second-stage gain amplifiers includes configuring the gain of the programmable gain amplifier so that it is programmable between a gain of less than unity and a gain above unity.

* * * * *